(12) United States Patent
Kondo et al.

(10) Patent No.: US 6,701,502 B1
(45) Date of Patent: *Mar. 2, 2004

(54) INTEGRATED CIRCUIT DEVICE, ARRANGEMENT/WIRING METHOD THEREOF, ARRANGEMENT/WIRING APPARATUS THEREOF, AND RECORDING MEDIUM

(75) Inventors: Atsuo Kondo, Osaka (JP); Takao Kuroda, Kyoto (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 13 days.

(21) Appl. No.: 09/072,137
(22) Filed: May 5, 1998

(30) Foreign Application Priority Data

May 6, 1997 (JP) .............................................. 9-115432

(51) Int. Cl.⁷ .............................. G06F 9/45; G06G 7/48
(52) U.S. Cl. ................................... 716/9; 716/10; 703/6
(58) Field of Search .......................... 395/500.1, 500.11; 716/9–10; 703/6

(56) References Cited

U.S. PATENT DOCUMENTS

| | | | | |
|---|---|---|---|---|
| 5,363,313 A | * | 11/1994 | Lee ........................ | 395/500.03 |
| 5,625,568 A | * | 4/1997 | Edwards et al. ........ | 395/500.03 |
| 5,636,132 A | * | 6/1997 | Kamdar ................... | 395/500.02 |
| 5,682,322 A | * | 10/1997 | Boyle et al. ............ | 395/500.09 |
| 5,729,469 A | * | 3/1998 | Kawakami ............. | 395/500.14 |
| 5,761,075 A | * | 6/1998 | Oi et al. .................. | 395/500.2 |
| 5,856,927 A | * | 1/1999 | Greidinger et al. .... | 395/500.13 |
| 5,943,486 A | * | 8/1999 | Fukui et al. ............. | 395/500.1 |

* cited by examiner

*Primary Examiner*—Hugh Jones
(74) *Attorney, Agent, or Firm*—McDermott, Will & Emery

(57) ABSTRACT

After the name of a signal line is entered, cells are arranged and, a channel to be wired therein is generated. After the completion of global wiring and minute wiring, a compaction process is performed. Here, the transistor density TD of an integrated circuit device to which the compaction process has been executed is compared with a standard value TDst. The compaction process is repeated unless TD>TDst, and terminated when TD >TDst. The time to terminate the compaction process can be judged from objective standards regardless of the level of a designer's skill, so as to keep the layout design of an integrated circuit device above a certain level.

12 Claims, 7 Drawing Sheets

INTEGRATED CIRCUIT DEVICE, ARRANGEMENT/WIRING METHOD THEREOF, ARRANGEMENT/WIRING APPARATUS THEREOF, AND RECORDING MEDIUM

BACKGROUND OF THE INVENTION

The present invention relates to an arrangement/wiring method and an arrangement/wiring apparatus for automatically designing layout patterns of an integrated circuit device, and to a recording medium which stores a program for making a computer execute the arrangement/wiring procedure.

As a conventional arrangement/wiring method of automatically designing layout patterns of an integrated circuit device, the minimization of the chip area after the arrangement/wiring or so called compaction is available.

FIG. 5 is a block diagram illustrating a conventional automatic arrangement/wiring apparatus for designing layout patterns. This apparatus comprises an entering unit 1 for entering instructions for cell arrangement or the like, a cell arrangement unit 2, a net list 3 which contains information on the connection of the logical circuit, and layout information 4 which contains physical information of cells to be arranged. The cell arrangement unit 2 arranges the cells which compose the logical circuit, using the net list 3 and the layout information 4 in response to the directions of the entering unit 1. The apparatus further comprises a channel generation unit 5 for determining the wiring area for each of the signal lines which connect the arranged cells, a global/minute wiring unit 6 for determining the wiring path for each of the signal lines in the wiring area and then wiring the signal lines, a compaction execution unit 7 for minimizing the chip area while fulfilling design rules 8 after the wiring of the global/minute wiring unit 6, and a display unit 10 for displaying the contents of an arrangement/wiring process, a compaction process, and the like.

The operation of the automatic arrangement/wiring apparatus thus constructed will be described as follows with reference to the flowchart shown in FIG. 6.

In step S1, the name of a signal line to be wired is entered based on the net list 3 which contains the information on the connection of the logical circuit and the layout information 4 which contains the physical information of the cells. In step S2, the cells are arranged either automatically or manually. In step S3, the wiring area for each of the signal lines which connect the cells is determined. This is referred to as channel generation. Generally, the area which is not involved in arranging the cells is assigned to the wiring area; however, there are cases where the wiring area can be set up on the cells, or a wiring prohibition area is set up. In step 4, the wiring paths for the signal lines which connect the terminals of the cells are roughly determined with reference to the entered net list 3. This is referred to as global wiring. Here, the wiring is conducted by assigning higher priorities to such signal lines that might cause remarkable inconvenience when they have long wiring lengths. To be more specific, signal lines with highest priorities are generally wired automatically so as to have the minimum wiring length and optimum timing. In the meantime, the paths for such specific signal lines as for a power source, ground, clock, and the like are usually wired manually.

In step S5, minute wiring including the determination of wiring positions in each channel is carried out. In the compaction process at step S6, the wiring is modified by hand so as to make the chip area as small as possible while fulfilling the design rules, and the process is terminated.

By means of the compaction process for minimizing the chip area, the designer repeats the modification of the wiring, so that the integration of the circuit gradually increases and the chip area decreases. As a result, it becomes possible to design an integrated circuit device with higher integration.

However, in the above-described compaction process, there is a limit to the repeated modification of the wiring by the designer. Furthermore, to prolong the time required for the compaction process for reducing the chip area goes against the demand for putting good products on the market as soon as possible.

In order to solve these problems, it is necessary to determine the completion of the compaction process, and it is possible to use the decrease rate of the chip area in each compaction process as a method of determining the completion. According to this method, as shown in FIG. 7, every time the compaction process is completed, the chip area Sn before the process and the chip area Sn+1 after the process are compared, then the decrease rate of the chip area $(S_n - S_{n+1})/S_n$ (n is the number of times of the compaction process) is compared with a specified value. To be more specific, when the decrease rate of the chip area is larger than the specified value, another compaction process is conducted, and when the decrease rate of the chip area is smaller than the specified value, the compaction process is terminated.

However, there is a problem that in spite of the provision of such standards for determining the completion time of the compaction process, the chip area of an integrated circuit device when its layout is finally designed differs depending on the difference in the level of the skills of designers.

To be more specific, since layout designers having different levels of technical skill conduct different wiring modification, the chip area after the completion of the process might greatly differ even under the same conditions. FIG. 8 is a graph showing the change in the chip area S along with the designing time (or number of times) in the cases of a skilled designer and an unskilled designer. In this graph, the curve A indicates the case of the unskilled designer and the curve B indicates the cases of the skilled designer. Since the decrease rate of the chip area S becomes lower than the specified value on both the curves A and B when the fifth compaction process is completed, the compaction process is terminated at that moment. However, the difference in the final chip area S between the curves A and B is obvious.

As described hereinbefore, there is a problem that the different levels of the skill of designers cause different integration degrees of an integrated circuit device.

SUMMARY OF THE INVENTION

The object of the present invention is to provide an arrangement/wiring method and arrangement/wiring apparatus for performing optimum arrangement/wiring regardless of the level of the skill of a designer, by establishing standards for objectively determining the completion of a compaction process, and also to provide a recording medium which stores the optimum arrangement/wiring procedure and an integrated circuit device which is produced in accordance with the arrangement/wiring method.

In order to achieve the above object, the present invention has a feature that the compaction process for minimizing the chip area while fulfilling the design rules is terminated when the number of elements per unit area exceeds a predetermined setting value.

The arrangement/wiring method of an integrated circuit device of the present invention is an arrangement/wiring method of an integrated circuit device for arranging cells each containing at least one element and wiring signal lines which connect the cells in the integrated circuit device comprising the steps of: performing a compaction process so as to reduce a chip area of the integrated circuit device in which the cells have been arranged and the signal lines have been wired while fulfilling design rules; obtaining the standard value of element density which is previously stored in a storage means and indicates the number of elements per unit area, and comparing the standard value with the element density of the integrated circuit device to which the compaction process has been executed; and ordering that the compaction process is repeated when the element density is smaller than the standard value, and ordering that the compaction process is terminated when the element density is larger than the standard value.

According to this method, the completion of the compaction process is judged by element density, which is an objective standard irrespective of the level of the skill of a designer. Consequently, it becomes possible to design layout patterns of an integrated circuit device which has uniform integration, and also to enhance the integration of the integrated circuit device.

In the cases where the elements arranged in an integrated circuit device differ in size or intervals, it is preferable to establish the standard value of the element density with various methods.

When the integrated circuit device includes memory, it is preferable that the standard value is predetermined to be larger than the standard value when the integrated circuit device includes no memory.

When the integrated circuit device includes an analog circuit, it is preferable that the above-mentioned standard value is predetermined to be smaller than the standard value when the integrated circuit device includes no analog circuit.

It is preferable that the above-mentioned standard value is predetermined based on the mean value of the element density of various types of integrated circuit devices which are actually manufactured in a distribution process of manufacturing integrated circuit devices.

When the integrated circuit device includes a plurality of types of circuits having different integration degrees, it is preferable that the above-mentioned standard value is predetermined to be the mean value of the standard values of the element density of the plurality of types of circuits.

The arrangement/wiring method may further comprise the step of displaying a level of the compaction process along with the number of times or the time of the compaction process.

According to this method, designers of the arrangement/wiring can know the levels of their skill in conducting the compaction process, so that they can improve the modification method of wiring in the compaction process, which leads to an improvement of the quality of an integrated circuit device to be designed.

The arrangement/wiring apparatus of an integrated circuit device of the present invention comprises: an arranging and wiring means for arranging cells each containing at least one element and for wiring signal lines which connect the cells; a compaction execution means for performing a compaction process so as to reduce a chip area of the integrated circuit device in which the cells have been arranged and the signal lines have been wired while fulfilling the design rules; a storage means for previously storing a standard value of element density, the standard value being the number of elements per unit area in the integrated circuit device; a comparison means for taking the standard value from the storage means and comparing the standard value with the element density of the integrated circuit device to which the compaction process has been executed; and a control means for controlling the compaction execution means, storage means, and comparison means in response to an output of the comparison means so that the compaction process is repeated when the element density is smaller than the standard value, whereas the compaction process is terminated when the element density is larger than the standard value.

Consequently, it becomes possible to achieve an arrangement/wiring apparatus particularly suitable for conducting the above-described arrangement/wiring method.

The recording medium of the present invention is capable of being placed and read in a computer which is used to arrange cells each containing at least one element, to wire signal lines for connecting the cells, and to perform a compaction process so as to reduce a chip area of an integrated circuit device in which the cells have been arranged and the signal lines have been wired while fulfilling design rules. The recording medium stores a program for making the computer execute the procedures of: taking out from a storage means the standard value of element density, which is a predetermined number of elements per unit area; comparing the standard value with the element density of the integrated circuit device to which the compaction process has been executed; and outputting orders that the compaction process is repeated when the element density is smaller than the standard value, whereas the compaction process is terminated when the element density is larger than the standard value.

By placing the above-described recording medium in a computer, the compaction process is carried out by the computer until the element density reaches the standard value. Thus, it becomes possible to produce layout patterns for an integrated circuit device having a fixed degree of integration, regardless of the level of the skill of the designer.

It is possible to further store a program for making the computer execute a procedure of performing the compaction process.

Consequently, the compaction process is automatically performed by the computer.

It is possible to further store a program for making the computer execute a procedure of making a display means display a level of the compaction process along with the number of times or the time of the compaction process.

Consequently, the level of the designer in conducting the compaction process is improved, and it becomes possible to design layouts of an integrated circuit device which have a higher quality.

The integrated circuit device of the present invention is an integrated circuit device in which cells each including at least one element have been arranged and signal lines for connecting the cells have been wired, wherein the element density, which is the number of elements per unit area in the integrated circuit device is adjusted to be close to and larger than a predetermined standard value.

Consequently, it becomes possible to obtain an integrated circuit device having uniform integration.

DETAILED DESCRIPTION OF THE INVENTION

The arrangement/wiring method and arrangement/wiring apparatuses of the embodiments of the present invention will be described as follows with reference to the drawings.

(EMBODIMENT 1)

Figure 1:
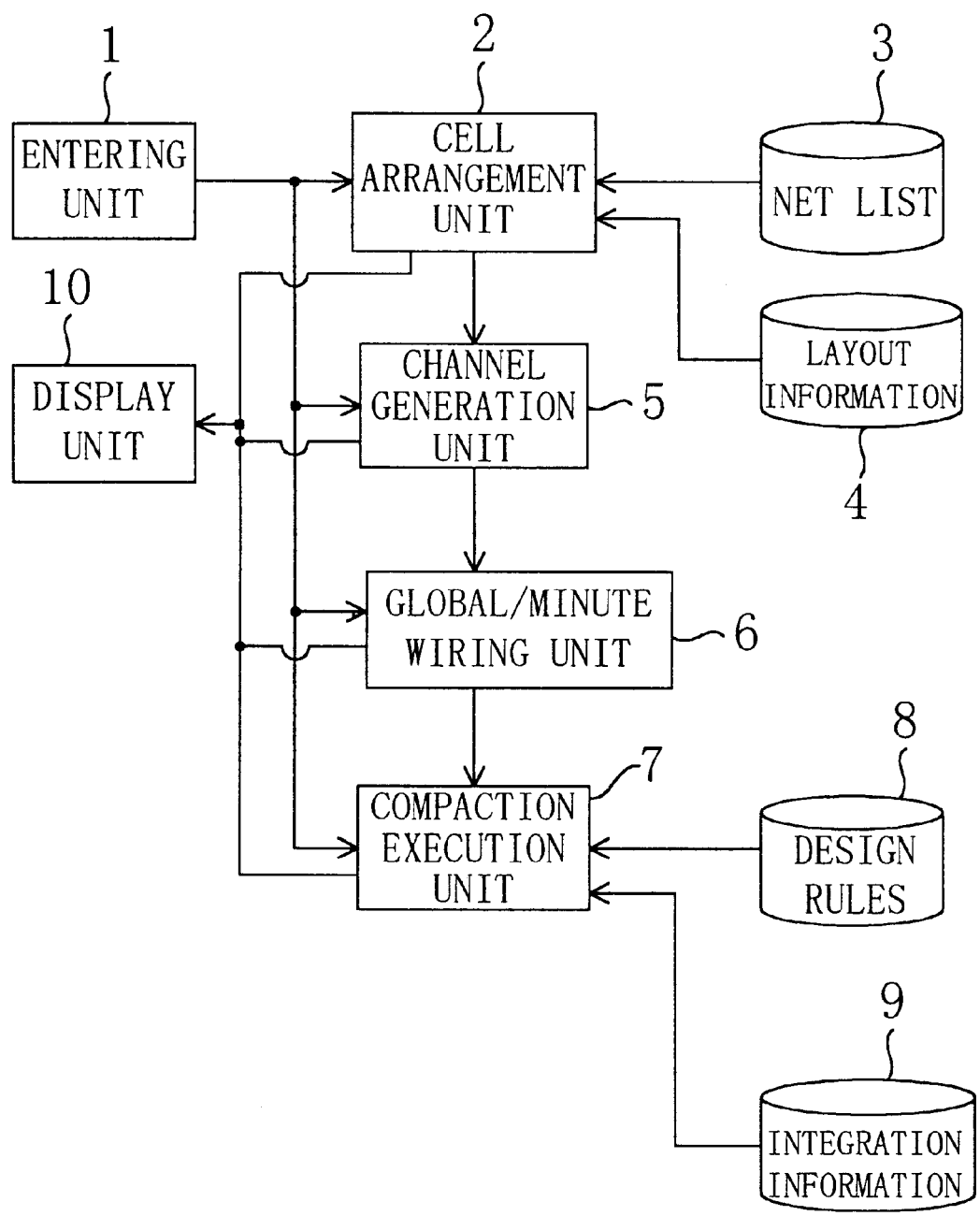
FIG. 1 is a block diagram of an automatic arrangement/wiring apparatus of the first embodiment.

FIG. 1 is a block diagram illustrating the construction of the automatic arrangement/wiring apparatus of the first embodiment. This apparatus comprises an entering unit 1 for entering instructions for cell arrangement or the like, a cell arrangement unit 2, a net list 3 which contains information on the connection of the logical circuit, and layout information 4 which contains physical information of cells to be arranged. The cell arrangement unit 2 arranges the cells which compose the logical circuit, using the net list 3 and the layout information 4 in response to the directions of the entering unit 1. The apparatus further comprises a channel generation unit 5 for determining the wiring area for each of the signal lines which connect the arranged cells, a global/minute wiring unit 6 for determining the wiring path for each of the signal lines in the wiring area and then wiring the signal lines, a compaction execution unit 7 for minimizing the chip area while fulfilling design rules 8 after the wiring of the global/minute wiring unit 6, and a display unit 10 for displaying the contents of an arrangement/wiring process and a compaction process, the number of times (or the time) of the compaction process, and the like.

In the apparatus which realizes the arrangement/wiring method of the present invention, memory contains, as integration information 9, the standard value TDst of the transistor density TD, which indicates the number of transistors per unit area in an integrated circuit device.

Figure 2:
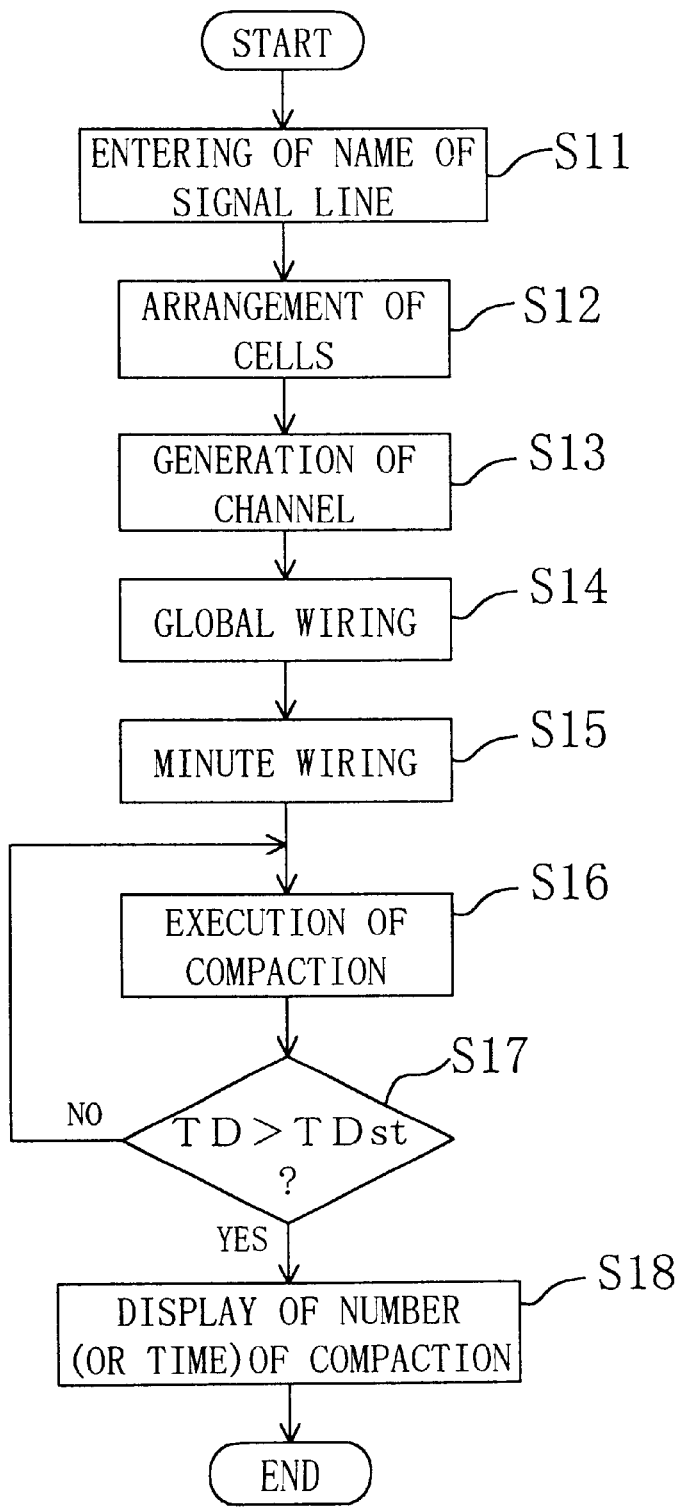
FIG. 2 is a flowchart depicting the flow of the arrangement/wiring method of the first embodiment.

FIG. 2 is a flowchart depicting the flow of the arrangement/wiring method of the present embodiment.

In step S11, the name of a signal line to be wired is entered based on the net list 3 which contains the information on the connection of the logical circuit and the layout information 4 which contains the physical information of cells.

In step S12, cells are arranged either automatically or manually.

In step S13, the wiring area for each of the signal lines which connect the cells is determined. This is referred to as channel generation. Generally, the area which is not involved in arranging the cells is assigned to the wiring area; however, there are cases where the wiring area can be set up on the cells, or a wiring prohibition area is set up.

In step 14, the wiring paths for the signal lines which connect the terminals of the cells are roughly determined with reference to the entered net list 3. Here, the wiring is carried out by assigning higher priorities to such signal lines that might cause remarkable inconvenience when they have long wiring lengths. To be more specific, signal lines with highest priorities are generally wired automatically so as to have the minimum wiring length and optimum timing. In the meantime, the paths for such specific signal lines as for a power source, ground, clock, and the like are usually wired manually.

In step S15, minute wiring including the determination of the wiring positions in each channel is carried out. In the compaction process at step S6, the wiring is manually modified so as to make the chip area as small as possible while fulfilling the design rules, and the process is terminated.

In step S17 which is the feature of the present embodiment, every time the compaction process is conducted in step S16 so as to reduce the chip area while fulfilling the design rules 8, the transistor density TD of the integrated circuit device is calculated. Then, the transistor density TD, which is based on the results of the compaction process, is compared with the standard value TDst contained in the integration information 9, which is taken out from memory. The transistor density TD is calculated by the following equation (1)

$$TD = Tr/A \tag{1}$$

In the equation, Tr represents the number of transistors in the chip and A represents the chip area. The standard value TDst contained in the integration information 9 is determined based on the mean value of the transistor density TD of the various types of integrated circuit devices which are actually manufactured in the distribution process for manufacturing integrated circuit devices.

As a result of the comparison in step S17, when the transistor density TD is not larger than the standard value TDst, the wiring is manually modified so that the compaction process is carried out again in step S16. In the meantime, when TD>TDst, the compaction process is terminated under the conclusion that the optimum integration of the integrated circuit device has been achieved as a result of the compaction process. Thus, the compaction process is repeated in step S16 until the transistor density TD exceeds the standard value TDst.

When the termination of the compaction process is determined, the number of times the compaction process has been carried out so far is displayed in step S18.

The compaction process unit 7 shown in FIG. 1 has functions corresponding to a compaction execution means for performing the process of step S16, a comparison means for performing the process of step S17, and a control means for transferring from step S17 to either step S16 or step S18 shown in the flowchart of FIG. 2.

Figure 4:
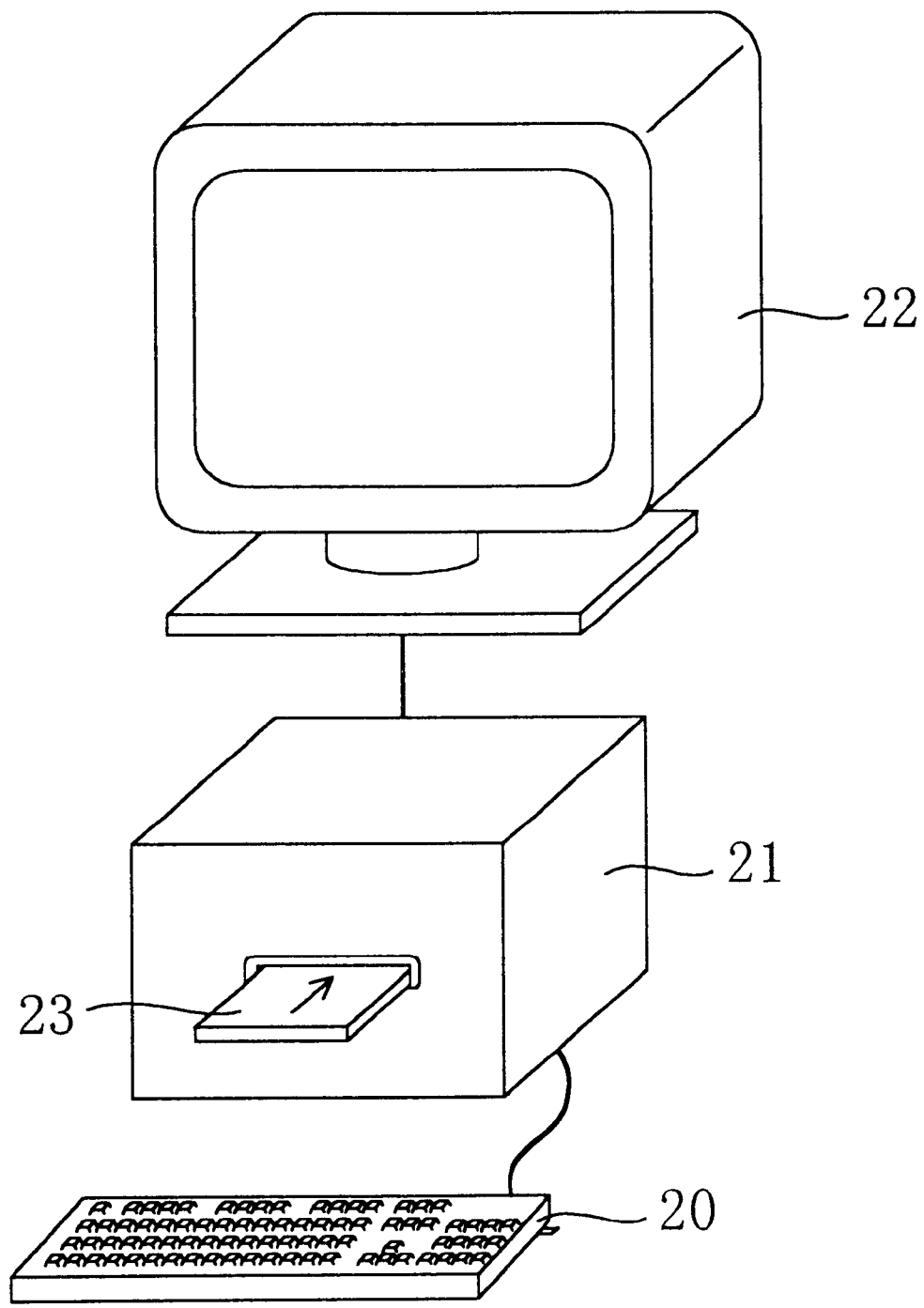
FIG. 4 is a perspective view illustrating a computer which functions as an automatic arrangement/wiring apparatus.
Figure 5:
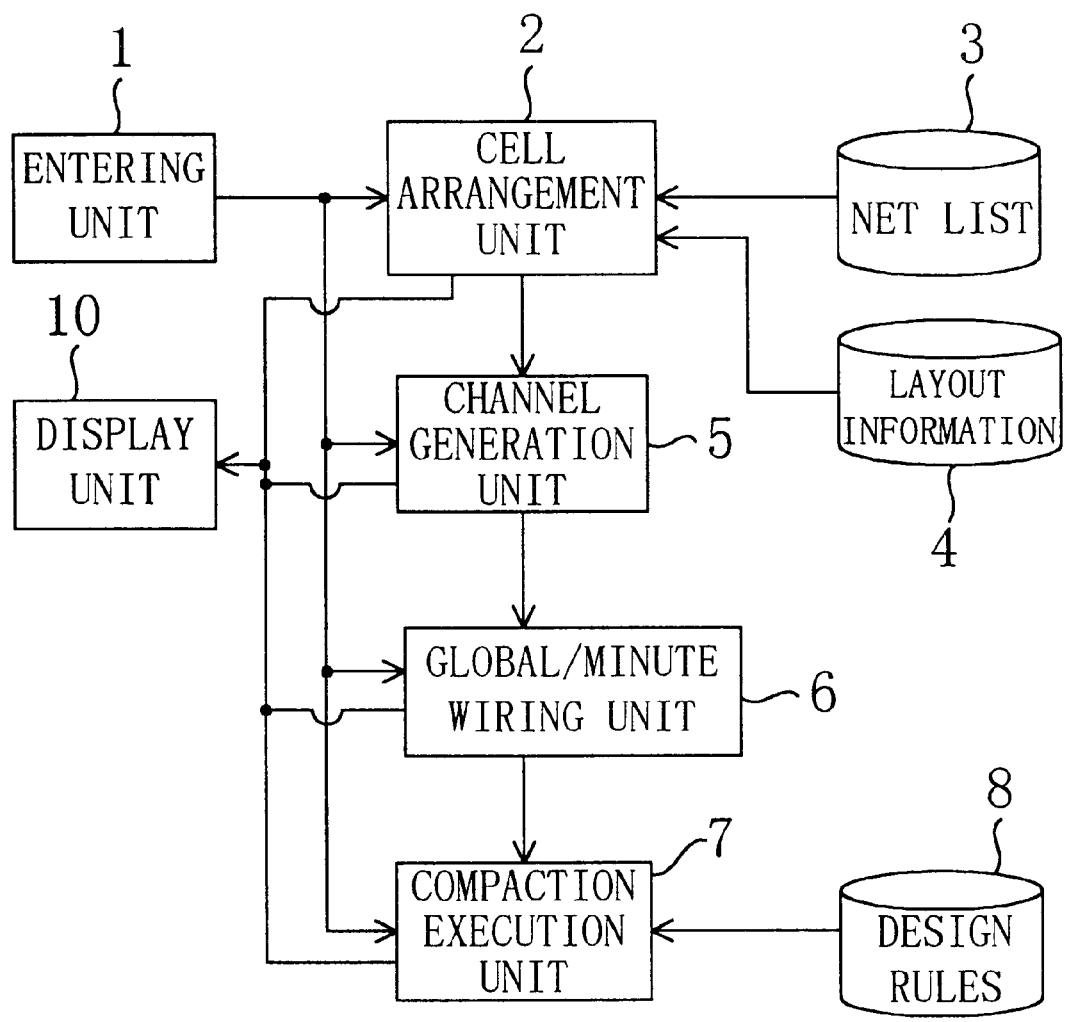
FIG. 5 is a block diagram illustrating a conventional automatic arrangement/wiring apparatus.
Figure 6:
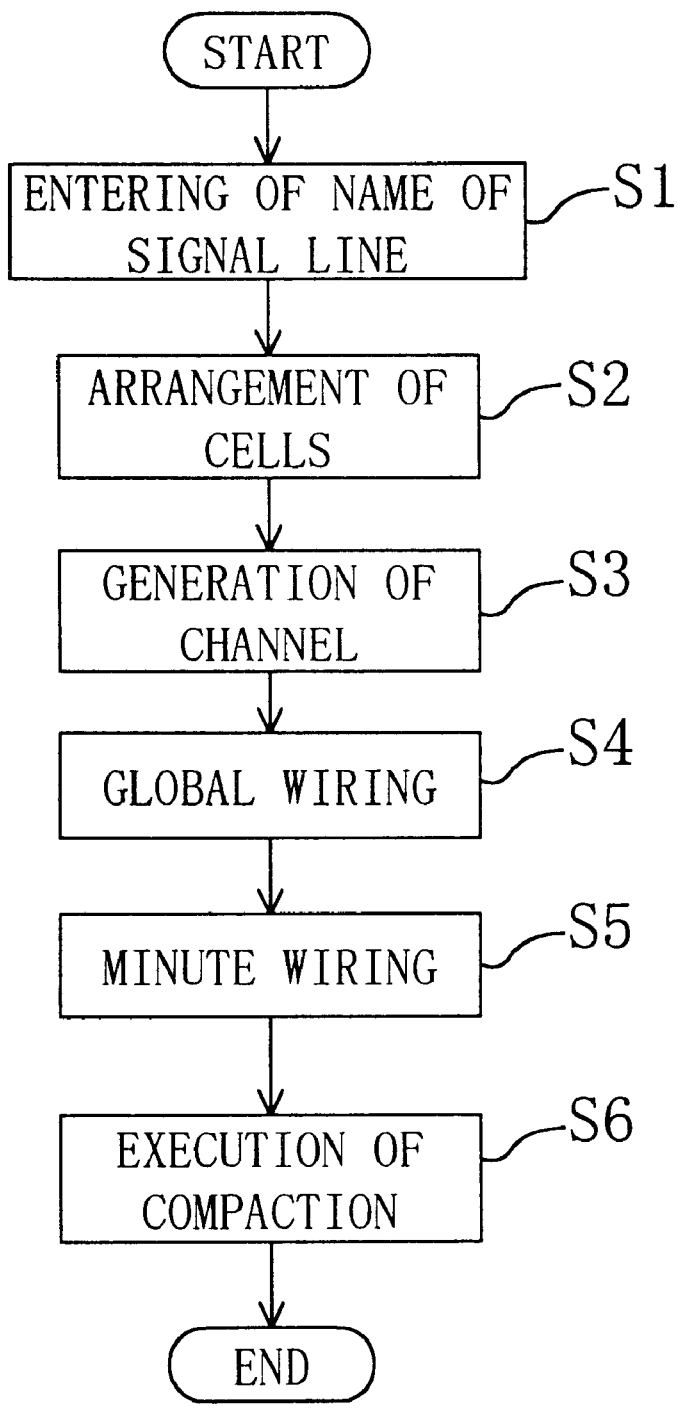
FIG. 6 is a flowchart depicting the flow of the automatic arrangement/wiring method in a conventional automatic arrangement/wiring apparatus.
Figure 7:
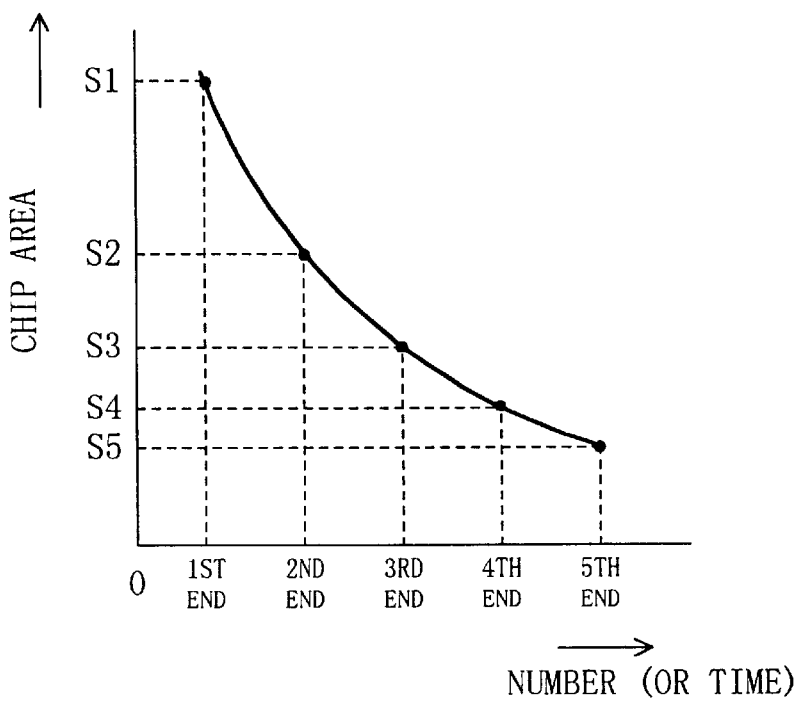
FIG. 7 is a graph showing a change in the chip area along with the number of times of the compaction process and showing a conventional method of determining the completion of the compaction process.
Figure 8:
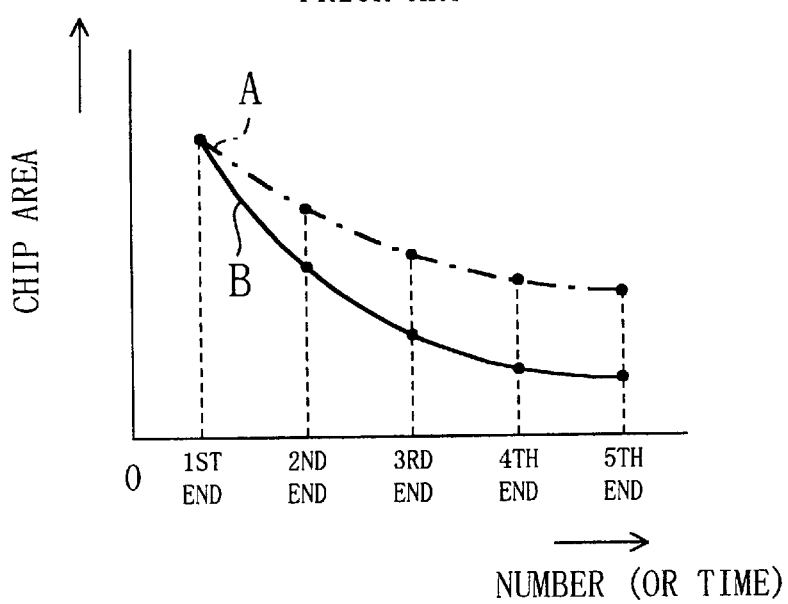
FIG. 8 is a graph showing the difference in change property of the chip area along with the number of times of the compaction process depending on the difference in level of the technical skill of designers, according to a conventional automatic arrangement/wiring method.

FIG. 4 is a perspective view of the outward construction of a computer which is used as the arrangement/wiring apparatus of the present embodiment. In this drawing, a keyboard 20 is provided with the function of the entering unit 1 shown in FIG. 1. A computer main body 21 includes a CPU and memory, and is provided with the functions of the net list 3, the layout information 4, memory for storing the design rules 8 and integration information 9, the cell arrangement unit 2 for arranging cells, the channel generation unit 5, the global/minute wiring unit 6, and the compaction execution unit 7. A display 22 has the function of the display unit 10 shown in FIG. 1, displays cells and signal lines during an arrangement/wiring process and a compaction process, and also displays the transistor density in the integrated circuit device after the compaction process and the number of times (or the time) of the compaction process.

A magnetic disk 23 (so called a floppy disk) is a recording medium which contains a program for making a computer execute the process shown in FIG. 2. By placing the magnetic disk 23 in the computer main body 21, the arrangement/wiring is carried out by the computer.

However, the recording medium of the present invention is not restricted to such an embodiment: the magnetic disk 23 does not have to contain a program for making a computer execute all the steps shown in FIG. 2, but has only to contain a program for making a computer execute a procedure of the comparison in step S17 and a procedure of the output of instructions for either the repetition or termination of the compaction process in accordance with the comparison results.

Figure 3:
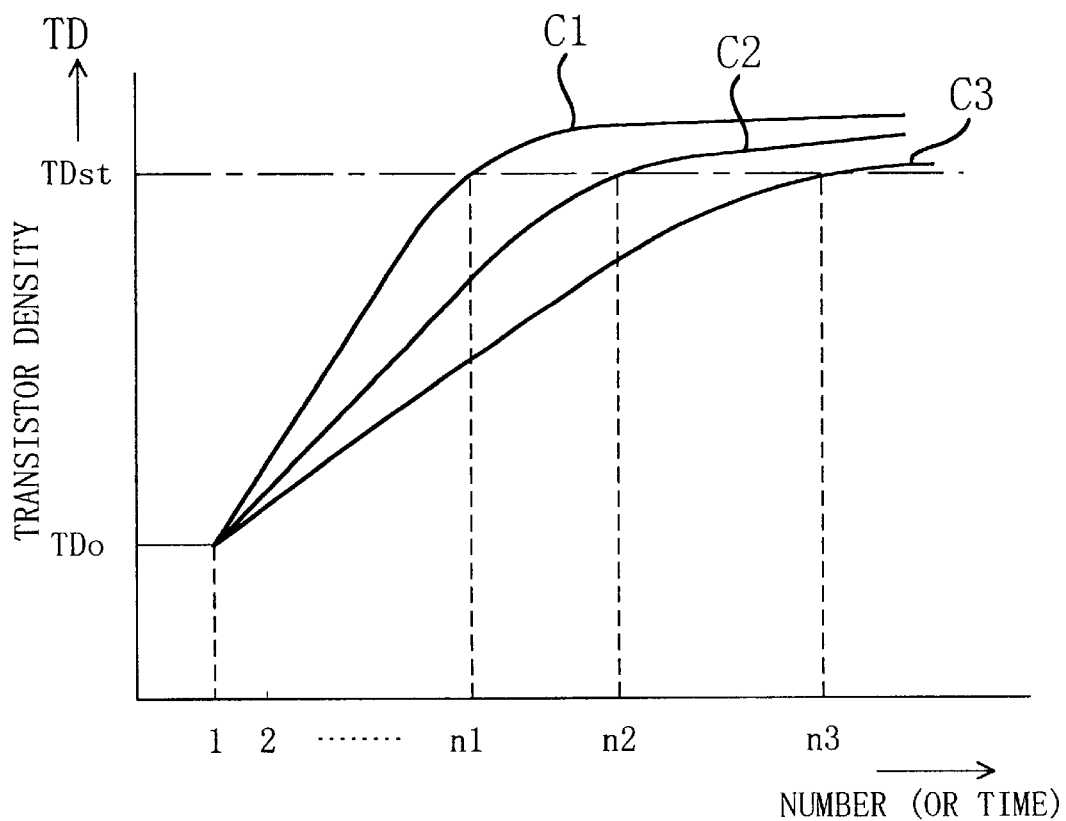
FIG. 3 is a graph showing a change in the transistor density TD along with the number of times of the compaction process conducted by designers having different levels of skill.

FIG. 3 is a graph showing the enhancement of the transistor density TD along with the number of times (or the time) of the compaction process. In this graph, the curves C1, C2, and C3 indicate a designer with high skill, a designer with medium skill, and a designer with low skill, respectively. It is assumed that the transistor density TD on these curves C1, C2, and C3 is the same at the point where the initial arrangement/ wiring is completed. When these designers design layouts and the predetermined standard value TDst is reached, the arrangement/wiring is terminated. When the number of times the compaction process has been carried out before these designers complete the arrangement/wiring are indicated as n1, n2, and n3, respectively, the number of times: n1, n2, and n3 are displayed for the respective designers. Hence, the designers can make a rough guess of their own skill from the number of times of the compaction process.

In the present embodiment, the moment when the transistor density TD reaches a predetermined standard value is regarded as the completion time of the compaction process. The transistor density TD (the number of transistors per unit area) is a standard which is not affected by the level of the skill of a designer. The establishment of such an objective standard keeps the integration of an integrated circuit device which goes through arrangement/wiring at a high level above a fixed value.

From the view point of enhancing the levels of designers' skill, they can tell their own levels from the number of times of the compaction process: n1, n2, and n3 (or the time) required for raising the integration above a standard value by means of the compaction process. This can be a guideline for the designers to improve their modification method of wiring. For example, in the case of the designer indicated by the curve C3 in FIG. 3, when there is no means for determining whether the transistor density TD has reached the standard value TDst as is the case of a conventional method, the compaction process is terminated at the moment when the increase rate of integration (that is, the decrease rate of the chip area) by the compaction process becomes small, under the conclusion that the chip area has been reduced to saturation by the compaction process. As a result, no improvement such as the modification of wiring is conducted. In the present embodiment, on the other hand, the compaction process must be continued until the transistor density TD reaches the standard value TDst. Therefore, it is necessary to improve the method of the compaction process, which leads to the quick and positive enhancement of the designers' skill in compaction process. As a result, the quality of an integrated circuit device can be also improved.

(EMBODIMENT 2)

The arrangement/wiring apparatus of the present embodiment has the same construction as the apparatus shown in FIG. 1, and the flow of its basic process is also the same as that shown in the flowchart of FIG. 2. In this embodiment, however, the standard value when the integrated circuit device includes memory is predetermined to be larger than the standard value when the integrated circuit device includes no memory. To be more specific, the standard value is predetermined as follows. In the arrangement/wiring apparatus shown in FIG. 1, the integration information 9 contains, as information on the transistor density TD, the standard value TDstme of the transistor density in memory and the standard value TDstpe of the transistor density in the circuits other than memory. The standard value TDst of the transistor density in the entire integrated circuit device is predetermined by the following equation.

$$TDst=(mTDstme+nTDstpe)/(m+n) \qquad (2)$$

Here, the occupied area ratio of memory to the circuits other than memory in the integrated circuit device is m:n.

In this case, it is possible to predetermine only the standard value TDstpe of the transistor density of the circuits other than memory, and then to determine the standard value TDstme of the transistor density in memory, based on the equation: TDstme=k TDstpe (k>1).

Thus, by predetermining the standard value of the integrated circuit device including memory larger than that of the apparatus including no memory, a more appropriate standard can be predetermined for the determination of the completion time of the compaction process. According to the manufacturing technique of the current integrated circuit devices, the reason for this is that transistors in a memory area are arranged more minutely and denser than transistors in a logic circuit area, so that an integrated circuit device including memory ought to have higher integration than an integrated circuit device including no memory.

The establishment of a standard value of an integrated circuit device including memory of the present embodiment is not limited to the method shown in the equation (2). For example, it is possible to predetermine only the standard value TDstpe of the transistor density of the circuits other than memory, and then to determine from experience the standard value TDstme of the transistor density in memory, based on the equation: TDstme=k TDstpe (k>1).

However, by making the mean value between the standard values TDstme and TDstpe the standard value of the transistor density of the entire integrated circuit device, the results of the compaction process can be evaluated in as an accurate standard value as possible.

In an integrated circuit device including an analog circuit, it is preferable to make the standard value smaller than that of an integrated circuit device including no analog circuit. The reason for this is that transistors arranged in an analog circuit are larger in size than transistors arranged in a digital circuit, so that an integrated circuit device including an analog circuit ought to have lower integration than an integrated circuit device including no analog circuit. For example, TDstdi which is the standard value of the transistor density in an analog circuit and TDstan which is the standard value of the transistor density in a digital circuit are predetermined so as to satisfy the equation: TDstan=i TDstdi (0<i<1). In the same manner as the above equation (2), the standard value TDst of the transistor density of the entire integrated circuit device can be predetermined in accordance with the occupied area ratio of the analog circuit to the digital circuit.

(Other embodiments)

A standard value, which is the integration information in the above embodiments is not limited to the mean value between the standard values TDstme and TDstpe, but can have a range of some percents above and below the mean value. In such a case, the comparison between the transistor density after the compaction process and the standard value is possible.

In the above embodiments, a magnetic disk is used as the recording medium; however, the present invention is not limited to such an embodiment. Besides magnetic disks, any other recording media can be used as long as they are readable by a computer, such as a bubble memory, which is another magnetic means, an optical disk which uses mechanical concavo-convex patterns, semiconductor memory such as ROM which uses the presence or absence of charges or the difference in electrical connection conditions, and a bar-coder which uses optical patterns.

What is claimed is:

1. An arrangement/wiring method of an integrated circuit device for arranging cells each containing at least one element and wiring signal lines which connect the cells in the integrated circuit device, said arrangement/wiring method comprising the steps of:

performing a compaction process so as to reduce a chip area of said integrated circuit device in which the cells have been arranged and the signal lines have been wired while fulfilling design rules;

obtaining a standard value of element density which is previously stored in a storage means and indicates a number of elements per unit area, and comparing said standard value with said element density of said integrated circuit device to which the compaction process has been executed; and repeating the compaction process when said element density is smaller than said standard value, and terminating the compaction process when said element density is larger than said standard value.

2. The arrangement/wiring method of claim 1, wherein when said integrated circuit device includes memory, said standard value is predetermined to be larger than a standard value when said integrated circuit device includes no memory.

3. The arrangement/wiring method of claim 1, wherein when said integrated circuit device includes an analog circuit, said standard value is predetermined to be smaller than a standard value when said integrated circuit device includes no analog circuit.

4. The arrangement/wiring method of claim 1, wherein said standard value is predetermined based on a mean value of element density of various types of integrated circuit devices.

5. The arrangement/wiring method of claim 4, wherein when said integrated circuit device includes a plurality of types of circuits having different limits of integration, said standard value is predetermined to be a mean value of standard values of element density of the plurality of types of circuits.

6. The arrangement/wiring method of claim 1 further comprising the step of displaying a level of the compaction process along with a number of iterations or time of the compaction process.

7. An arrangement/wiring apparatus of an integrated circuit device, said arrangement/wiring apparatus comprising:

an arranging and wiring means for arranging cells each containing at least one element and for wiring signal lines which connect the cells;

a compaction execution means for performing a compaction process so as to reduce a chip area of said integrated circuit device in which the cells have been arranged and the signal lines have been wired while fulfilling the design rules;

a storage means for previously storing a standard value of element density, said standard value being a number of elements per unit area in said integrated circuit device;

a comparison means for taking said standard value from said storage means and comparing said standard value with said element density of said integrated circuit device to which the compaction process has been executed; and a control means for controlling said compaction execution means, storage means, and comparison means in response to an output of said comparison means so that the compaction process is repeated when said element density is smaller than said standard value, whereas said compaction process is terminated when said element density is larger than said standard value.

8. The arrangement/wiring apparatus of claim 7 further comprising a display means for displaying a level of the compaction process along with a number of iterations or time of the compaction process.

9. A recording medium capable of being placed and read in a computer which is used to arrange cells each said cell containing at least one element, to wire signal lines for connecting the cells, and to perform a compaction process so as to reduce a chip area of an integrated circuit device in which the cells have been arranged and the signal lines have been wired while fulfilling design rules, said recording medium storing a program for making the computer execute the procedures of:

taking out from a storage means a standard value of element density, which is a predetermined number of elements per unit area;

comparing said standard value with said element density of said integrated circuit device to which the compaction process has been executed; and outputting instructions that the compaction process is repeated when said element density is smaller than said standard value, whereas the compaction process is terminated when said element density is larger than said standard value.

10. The recording medium of claim 9 further storing a program for making the computer execute a procedure of performing the compaction process.

11. The recording medium of claim 9 further storing a program for making the computer execute a procedure of making a display means display a level of the compaction process along with a number of times or time of the compaction process.

12. An integrated circuit device in which cells each including at least one element have been arranged and signal lines for connecting the cells have been wired, wherein element density, which is a number of elements per unit area in said integrated circuit device is adjusted to be close to and larger than a predetermined standard value.

* * * * *